(12) United States Patent
Chang et al.

(10) Patent No.: US 7,506,231 B2
(45) Date of Patent: Mar. 17, 2009

(54) WRAPPER TESTING CIRCUITS AND METHOD THEREOF FOR SYSTEM-ON-A-CHIP

(75) Inventors: Yeong-Jar Chang, Hsinchu (TW); Wen-Ching Wu, Hsinchu (TW); Kun-Lun Luo, Hsinchu (TW); Chia-Jen Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/819,464

(22) Filed: Jun. 27, 2007

(65) Prior Publication Data

US 2007/0255986 A1 Nov. 1, 2007

Related U.S. Application Data

(63) Continuation-in-part of application No. 11/140,745, filed on Jun. 1, 2005, now abandoned.

(30) Foreign Application Priority Data

Dec. 29, 2004 (TW) ............................... 93141234 A

(51) Int. Cl.
*G01R 31/28* (2006.01)
*G11C 29/00* (2006.01)

(52) U.S. Cl. .................... 714/726; 714/718
(58) Field of Classification Search ............... 714/724, 714/726, 727, 729, 718, 719, 720
See application file for complete search history.

(56) References Cited

U.S. PATENT DOCUMENTS

| | | | |
|---|---|---|---|
| 5,889,788 A | 3/1999 | Pressly et al. | |
| 6,249,893 B1 | 6/2001 | Rajsuman et al. | |
| 6,581,187 B2* | 6/2003 | Gupta et al. | 716/1 |
| 6,587,979 B1* | 7/2003 | Kraus et al. | 714/720 |
| 6,687,865 B1 | 2/2004 | Dervisoglu et al. | |
| 6,701,476 B2 | 3/2004 | Pouya et al. | |
| 6,877,122 B2 | 4/2005 | Whetsel | |
| 7,203,873 B1* | 4/2007 | Adams et al. | 714/718 |
| 7,290,186 B1* | 10/2007 | Zorian et al. | 714/718 |
| 2003/0167427 A1* | 9/2003 | Kraus et al. | 714/718 |
| 2004/0153915 A1* | 8/2004 | McLaurin | 714/724 |

(Continued)

OTHER PUBLICATIONS

A Hierarchial Test Scheme for System-on-Chip Designs by Li et al. Proceedings of the 2002 Design Automation and Test Europe pp. 1530-1591/02.*

(Continued)

*Primary Examiner*—Cynthia Britt
(74) *Attorney, Agent, or Firm*—Birch, Stewart, Kolasch & Birch, LLP

(57) ABSTRACT

A wrapper testing circuit of system-on-a-chip for electrical tests of at least a core circuit of an integrated circuit and a wrapper testing method thereof are provided. A controller outputs control signals and test signals and receives result signals executed by the core circuit. The wrapper testing circuit comprises a decoding logic and a plurality of wrapper boundary registers. The decoding logic has a signal decoding table which receives and decodes the control signals and then issues decoded signals according to the signal decoding table. The WBR shifts, updates and captures the test signals for the core circuit to execute and output the result signals according to the decoded signals. In comparison with prior art, the testing time is reduced.

8 Claims, 8 Drawing Sheets

U.S. PATENT DOCUMENTS

2005/0005217 A1    1/2005   Whetsel
2006/0064608 A1    3/2006   Whetsel

OTHER PUBLICATIONS

"Deterministic inter-core synchronization with periodically all-in-phase clocking for low-power multi-core SoCs" by Nose et al. Solid-State Circuits Conference, 2005. Digest of Technical Papers. ISSCC. 2005 IEEE International Publication Date: Feb. 10-10, 2005 On pp. 296-599 vol. 1 ISSN: 0193-6530 ISBN: 0-7803-8904-2.*

Marinissen et al. "Wrapper design for embedded core test". Welcome to IEEE Xplore Release 2.1 pp. 911-920, Oct. 5, 2000.

* cited by examiner

WRAPPER TESTING CIRCUITS AND METHOD THEREOF FOR SYSTEM-ON-A-CHIP

CROSS-REFERENCE TO RELATED APPLICATIONS

This application is a continuation-in-part patent application of U.S. application Ser. No. 11/140,745 filed on Jun. 1, 2005 now abandoned, the entire contents of which are hereby incorporated by reference for which priority is claimed under 35 U.S.C. § 120.

BACKGROUND

1. Field of Invention

The invention relates to a test circuit, and in particular to a test circuit that is applicable for system-on-a-chip and compliant with IEEE 1500 standard.

2. Related Art

Continuous development of integrated circuits has increased in the chip integrity such that integrating a complicated system on an independent System-On-a-Chip (SOC) has become an economic and feasible scheme. Chip integrated applications have thus also increased. System-On-a-Chip combines core circuits, such as microprocessor, digital signal processor (DSP), memory, digital to analog converter (DAC), analog to digital converter (ADC), phase lock loop (PLL), logic circuits and so on. However, the fault coverage greatly decreases. For verifying oneness of chips effectively, the Institute of Electrical & Electronic Engineers (IEEE) has provided a test standard: IEEE 1500 for System-On-a-Chip to solve the problem of low fault coverage.

The purpose of the IEEE 1500 standard is to define a standard test interface for the core circuits. The standard (a) defines the test interface between core circuits; (b) establish an access and isolation mechanism for core circuits such that the test patterns and procedures designed for these core circuits may be reused; (c) is capable of testing the interconnections between core circuits and testing User-Defined Logic (UDL); (d) integrates the core circuits compliant with IEEE 1500 standard into System-On-a-Chip by way of plug-and-play, and the testing between core circuits is need to cooperate with one another.

However, IEEE 1500 only establishes a standard for the test access and isolation mechanism including control mechanism of pin protocols and test modes for core circuits. However, the architecture of the test access mechanism (TAM) of the system is reserved for system developers. Furthermore, the test scheme of the core circuits such as BIST or scan is reserved for core designers. IEEE 1500 is in charge of supporting, activating, and controlling these test circuits for test operations.

In the test scheme of IEEE 1500, the core circuits could be tested with the IEEE 1500 standard wrapper through the standard test interface such as WSI/WSO, and the I/O ports of the test access mechanism (TAM-source, TAM-link). The test data is delivered to the core circuit by way of TAM-source and/or WSI 101, and the test results are outputted from TAM-sink and/or WSO 103. The control signals necessary for the test data transfer are provided by a central test controller.

FIG. 1 illustrates the test scheme. The test wrapper includes four registers 11~14, multiplexers 15~16, a bypass register 17, a Wrapper Instruction Register decoder 18 (WIR decoder), and an instruction register 19 (Wrapper Instruction Register, WIR) to test the core circuit 10. The registers 11~14 are Wrapper Boundary Registers (WBR), each composed of a plurality of Wrapper Boundary Cells (WBC). The number of the Wrapper Boundary Cells corresponds to the I/O ports of a core. The instruction 19 is a multi-bit register which length depending on how many bits that the wrapper test instruction is defined.

The data path starts from Wrapper Serial Input (WSI) 101 to Wrapper Serial output (WSO) 103 passing through registers and multiplexers.

To elaborate on the test procedure in more detailed, please refer to FIG. 2. WBR 130, 132 are disposed corresponding to input ports 110 and output ports 112 of the core circuit 10. A controller (not shown in the figure) outputs control signals and test signals for the core circuit 10 to be tested. The control signals are outputted via SelectWIR, ShiftWR 120, UpdateWR 122 and CaptureWR 124. The test signals are outputted via WSI 101 for WBR, Bypass Register 140 and WIR 142. The controller also outputs clock signals via WRCK 126 (Wrapper Clock) for WBR, Bypass Register 140 and WIR 142. The WIR decoder 144 decodes the test instruction inside the WIR 142 to control a multiplexer 150. SelectWIR 148 is used to control a multiplexer 152 to decide which signal to be outputted to the WSO 103 as the result signals. The WSO 103 is controlled by the multiplexer 150 and 152 which are controlled by WIR decoder 144 and SelectWIR 148. Because the controller does not directly control multiplexers 150 and 152, the controller should compile the test into the corresponding instruction and send the instruction to WIR 142 through WSI 101 at the beginning of each test (this will be depicted in the followings).

FIG. 3 illustrates a timing diagram for one single core circuit tested with a two-step test and an IEEE 1500 standard complinant wrapper. Please refer to FIG. 2 and FIG. 3 simultaneously. When the controller proceeds a bypass test 150, the controller should do operations of instruction 160a and execution 162a. The controller at first compiles of the bypass test into bypass instruction 161a, sends out the bypass instruction 161a through WSI 101 into WIR 142 to do 160a instruction operation and then sends control 163 signals of execution via ShiftWR 120, UpdateWR 122 and CaptureWR 124 for the bypass register 17 to do execution 162a operation. Sending the bypass instruction 161a into WIR 142 usually takes a few clocks, for example 4 clocks, depending on how many bits the WIR 142 has. When the controller controls the core circuit 10 to do a WCORETEST 152 test, the controller should proceed at least the following operations in sequence: instruction 160b, scan-in 164, execution 162b and scan-out 168. As shown in FIG. 3, the operation of execution 162b originally takes two or more clocks depending on the design of test controller. In practical, the operation of execution 162b takes only one clock owing that the test signals 165 in the next operation (scan 166) is pushed ahead one clock as shown in WSI. That means the test signals 165 in scan 166 operation are not sent at the beginning (the first clock) of scan 166 operation, but are sent one clock ahead of the beginning of the scan 166 operation. If the WCORETEST is a two-step test procedure, the controller proceeds the following operations in sequence: instruction 160b, scan-in 164, execution 162b, scan 166, execution 162c and scan-out 168. In other words, the two-step test procedure needs one more scan 166 and one more execution 162c operations to be inserted behind the execution 162b. Consequently, a three-step test procedure of WCORETEST should proceed instruction 160b, scan-in 164, execution 162b, scan 166, execution 162c, scan 166, execution 162c, scan-out 168.

When the controller proceeds the instruction 160a or the scan 166 operation, the ShiftWR 120 of control signals 163 should be at high level as well as the UpdateWR 122 and CaptureWR 124 should be at low level. When the controller proceeds the execution 162a operation, the UpdateWR 122 should be at high level in the first clock followed by CaptureWR 124 at high level.

Please refer to FIG. 2 again. Another core circuit 10' (shown in dotted lines) is disposed next to the core circuit 10. The another core circuit 10' has its own test circuits which are the same as that of the core circuit 10 and connected to the core circuit 10'. These two core circuits 10, 10' are controlled by the same controller. If there are five core circuits, the five core circuits are connected in serial. Practically, a controller controls a few hundreds of core circuits at the same time.

Please continuously refer to FIG. 4 illustrating a timing chart for three core circuits tested with a two-step test procedure according to IEEE 1500 standard. If the three core circuits are tested with a two-step test procedure, most operations in FIG. 4 are three times in clock length than the operations in FIG. 3. The instructions 180a, 180b are three times in clock length than the instructions 160a, 160b in FIG. 3. The execution 182a, 182b, 182c is three times in clock length than the execution 162a in FIG. 3. The scan-in 184, scan 186 and scan-out 188 are also three times in clock length than the scan-in 164, scan 166 and scan-out 168.

IEEE 1500 defines test wrappers, which have a plurality of instruction registers, surrounding the core circuits to control the boundary scan circuits. However, as depicted as above, the more core circuits are tested simultaneously, the more time it takes. This increases the test time and test cost. Therefore, there is an urgent need to provide a test scheme to reduce the test time and cost effectively.

Furthermore, System-On-a-Chip has more advantages in terms of weight, volume, performance, and price than the conventional circuit board systems. If the testing scheme is not taken into consideration with system design, the test cost may exceed the manufacturing cost during mass production because the testing time is propositional to the circuit scale. Therefore, the test scheme for development of System-On-a-Chip is a main point during system design.

SUMMARY

Accordingly, the invention relates to a wrapper testing circuit of system-on-a-chip that substantially obviates one or more of the abovementioned problems resulting from the limitations and disadvantages of the related art.

In accordance with one embodiment, the present invention provides a wrapper testing circuit of system-on-a-chip for electrical tests of at least a core circuit of an integrated circuit. A controller outputs control signals and test signals and receives result signals executed by the core circuit. The wrapper testing circuit comprises a decoding logic and a plurality of wrapper boundary registers (WBR). The decoding logic has a signal decoding table which receives and decodes the control signals and then issues decoded signals according to the signal decoding table. The WBR shifts, updates and captures the test signals for the core circuit to execute and output the result signals according to the decoded signals.

According to the embodiment above, the controller sends out control signals including instruction, execution and scan to the decoding logic to be decoded. Therefore, the operation and clock time of sending instruction via WSI into WIR are omitted. The total testing time is reduced.

According to another embodiment, the present invention provides a wrapper testing circuit of system-on-a-chip for electrical tests of at least a core circuit of an integrated circuit. A controller outputs control signals and test signals and receives result signals executed by the core circuit. The controller compiles the control signals ahead of the test signals. The wrapper testing circuit comprises a decoding logic, a plurality of WBR and a wrapper instruction register (WIR). The decoding logic has a signal decoding table which receives and decodes the control signals and issues decoded signals according to the signal decoding table. The WIR receiving and storing the compiled control signals ahead of the test signals. The WBR shifts, updates and captures the test signals for the core circuit to execute and output the result signals according to the decoded signals and the compiled signals from the WIR.

The present invention further provides a wrapper testing method of system-on-a-chip for electrical tests of at least a core circuit of an integrated circuit. A controller outputs control signals and test signals and receives result signals executed by the core circuit. The control signals at least have an updating signal and a capturing signal. The method comprises steps of: encoding the control signals by a decoding logic and output decoded signals; and shifting, updating and capturing the test signals for the core circuit to execute and output the result signals according to the decoded signals.

The wrapper testing circuit in accordance with the invention provides an effective way to shorten test time, and thereby the test cost for SOC is reduced. Furthermore, the disclosed test scheme is compliant with IEEE 1500 standard.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

BRIEF DESCRIPTION OF THE DRAWINGS

The above and other objects, features and other advantages of the invention will be more clearly understood from the following detailed description when taken in conjunction with the accompanying drawings, in which.

DETAILED DESCRIPTION

Figure 5:
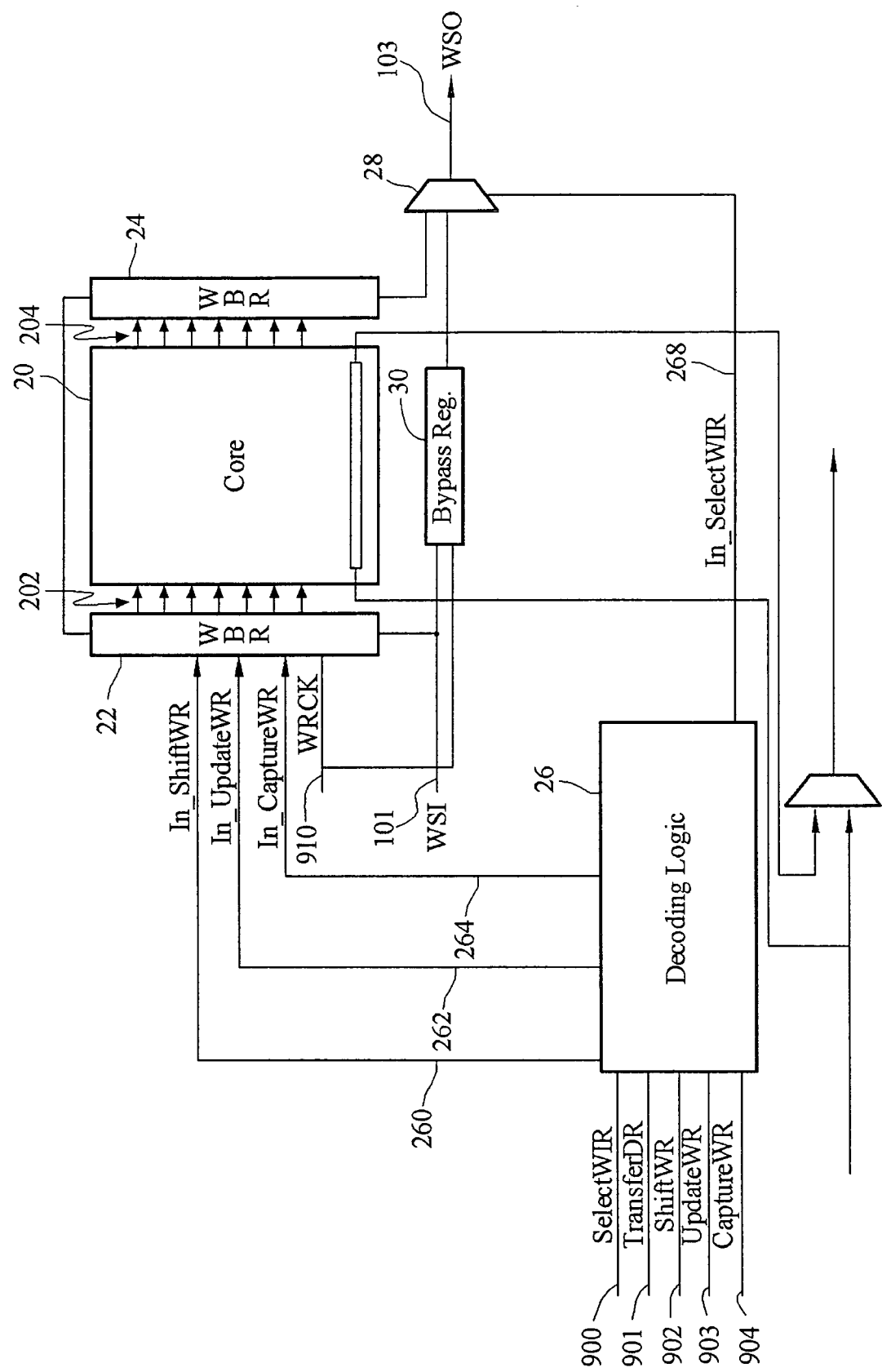
FIG. 5 illustrates the test scheme for system-on-a-chip in accordance with the invention.

FIG. 5 illustrates the test scheme for system-on-a-chip in accordance with the invention. The test scheme utilizes a direct test mode to test the core circuit 20. The test circuit at least includes a decoding logic 26 and WBR 22, 24 disposed corresponding to input ports 202 and output ports 204 of the core circuit 20. The decoding logic 26 has a signal decoding table as shown in TABLE I. The decoding logic 26 receives control signals sent from a controller (not shown in the figure) through SelectWIR 900, TransferDR 901, ShiftWR 902, UpdateWR 903 and CaptureWR 904 and decodes the control signals into decoded signals. The decoded signals are sent to WBR 22 via In_ShiftWR 260, In_UpdateWR 262 and In_CaptureWR 264, and sent to multiplexer 28 via In_SelectWIR 268. Referring to the FIG. 5, WBR 22 and multiplexer 28 are directly controlled by the decoding logic 26. The multiplexer 28 receives both thetest signals from the bypass register 30 and the result signals from the WBR 24 and selectively outputs the received test signals or the received result signals to the controller. Therefore, the controller does not need to compile the test procedure (control signals) into compiled signals (instruction signals) or send the compiled signals (instruction signals) into WIR like what the prior art does. The controller sends clock signals through WRCK 910 to WBR 22 and Bypass Register 30.

Please refer to TABLE I below. The SelectWIR 900, TransferDR 901, ShiftWR 902, UpdateWR 903 and CaptureWR 904 are from the controller while In_ShiftWR 260, In_UpdateWR 262, In_CaptureWR 264 and In_SelectWIR 268 are used to control the core circuit 20 to be tested. According to the table, when the controller proceeds a scan operation of WCORETEST test, the controller should send UpdateWR 903 at high level and others control signals at low level. The decoding logic decodes and issues the control signals as In_ShiftWR 260 at high level and others at low level for the core circuit 20 to be tested by the scan operation. Likewise, when the controller proceeds bypass operation, the controller should send all the five control signals at high level. The decoding logic decodes the control signals as In_ShiftWR 260 and Sel_WR_DR 268 at high level and other control signals at low level to control the core circuit 20 to be tested by the bypass operation.

Figure 6:
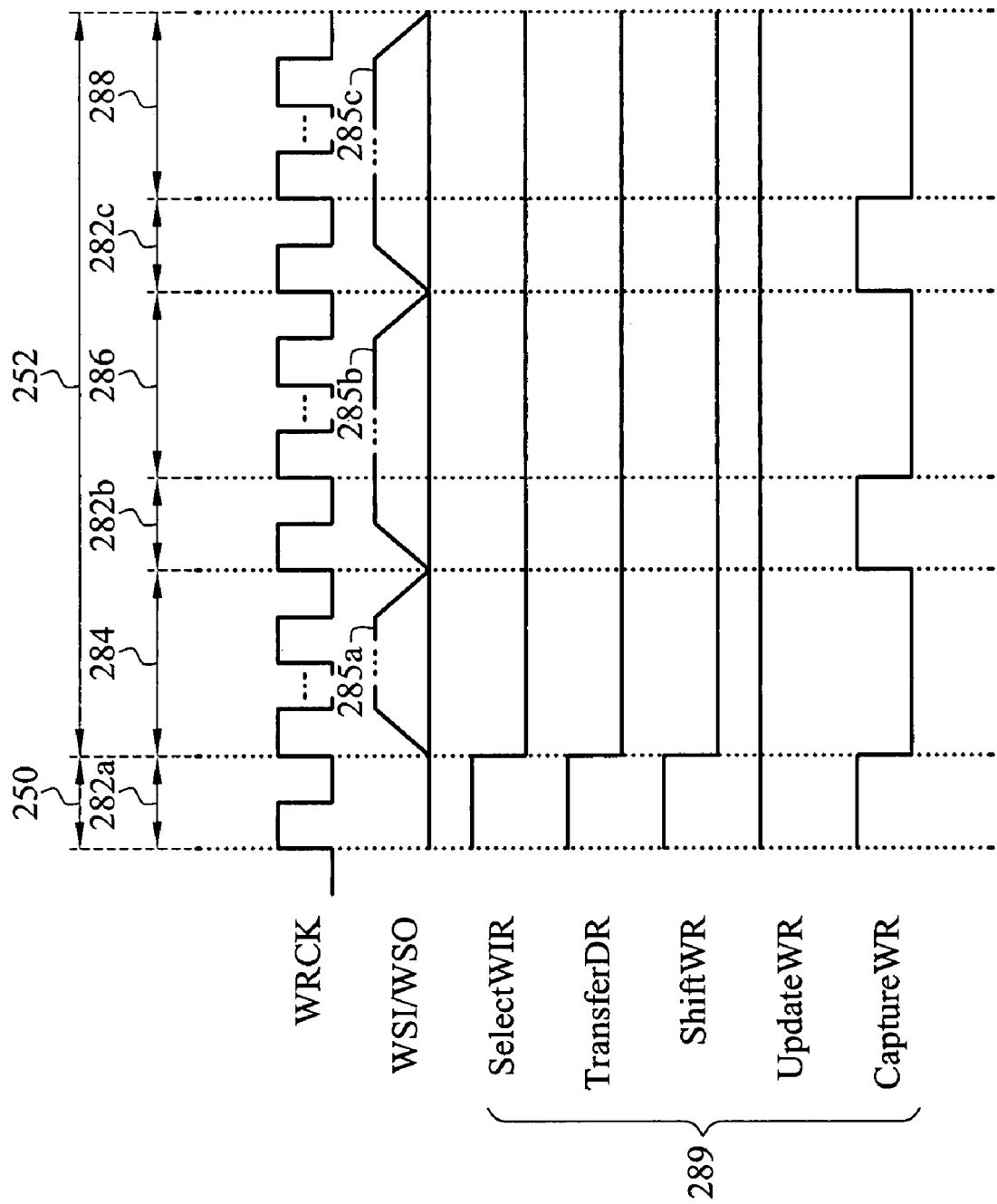
FIG. 6 illustrates a timing chart for one single core circuit tested with a two-step test procedure according to the present invention.

Please continuously refer to FIG. 6 illustrating a timing chart for one single core circuit tested with a two-step test procedure according to the above test scheme. The controller outputs control signals 289 and test signals 285a, 285b and receiving result signals 285c executed by the core circuit. The controller proceeds the same test to the core circuit 20 as that the controller does in FIG. 3. The controller proceeds a bypass 250 test and a WCORETEST 252 test. As shown in FIG. 6, the bypass test only takes one clock cycle owing that the test scheme does not need to send compiled signals into instruction register. In addition, when the controller sends ShiftWR 902 and CaptureWR 904 at high level to do execution 282a operation, the decoding logic 26 makes the In_UpdatWR 262 and In_CaptureWR 264 at high level in one clock cycle. Therefore, WBR 22, 24 update and capture test signals in one clock cycle. This makes the execution finished within one clock length which is one clock reduction compared to prior art.

Further, when the controller controls the core circuit 20 to do a WCORETEST 252 test with a two-step test procedure, the controller should proceed at least the following operations in sequence: scan-in 284, execution 282b, scan 286, execution 282c and scan-out 288. In comparison with FIG. 3, there is no need to do instruction operation in the present invention. Next, the clock length of doing the execution 282b, 282c operation is one clock cycle less than that of FIG. 3.

Figure 4:
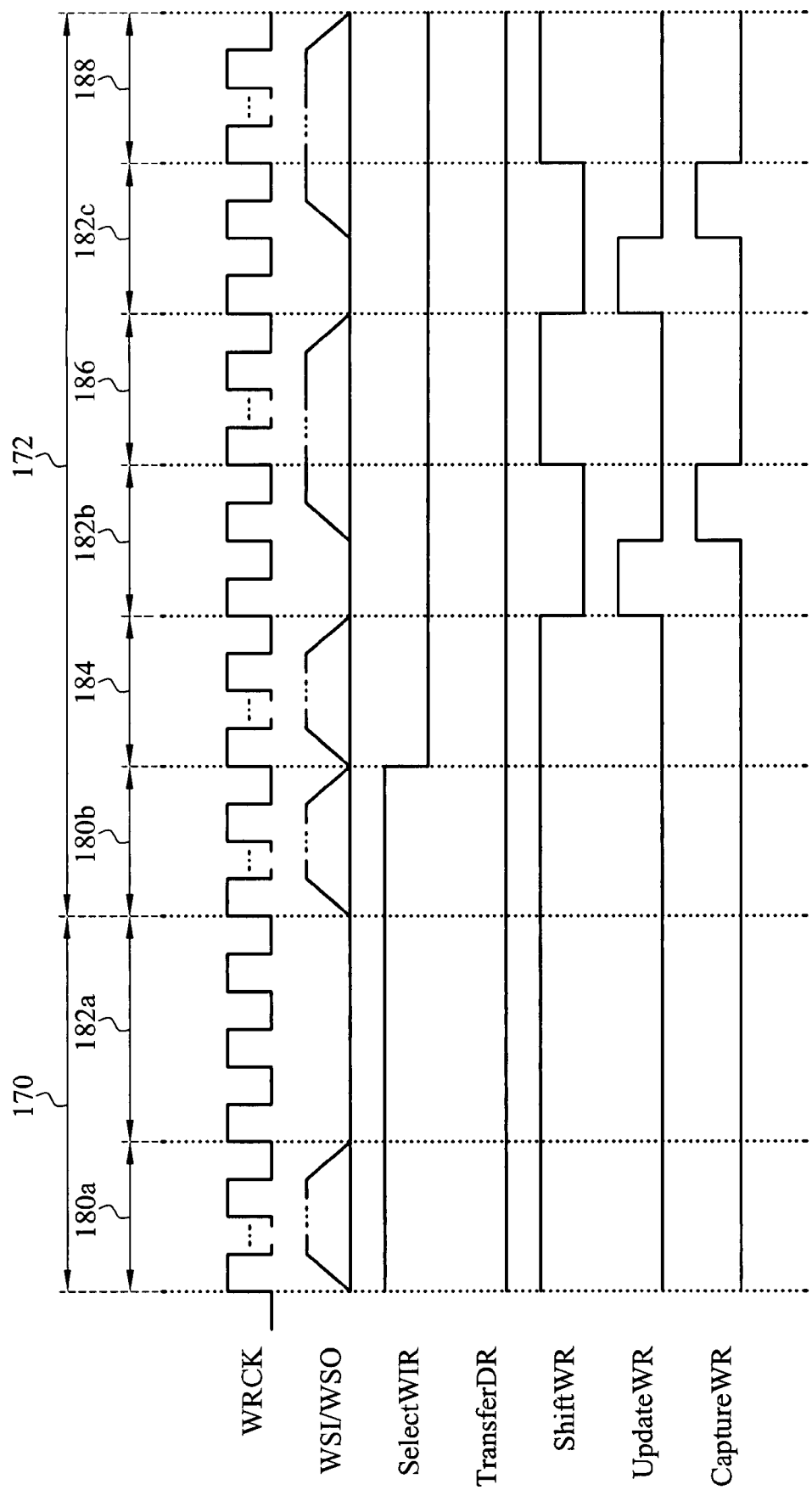
FIG. 4 illustrates a timing chart for three core circuits tested with a two-step test procedure and three IEEE 1500 standard compliant wrappers.
Figure 7:
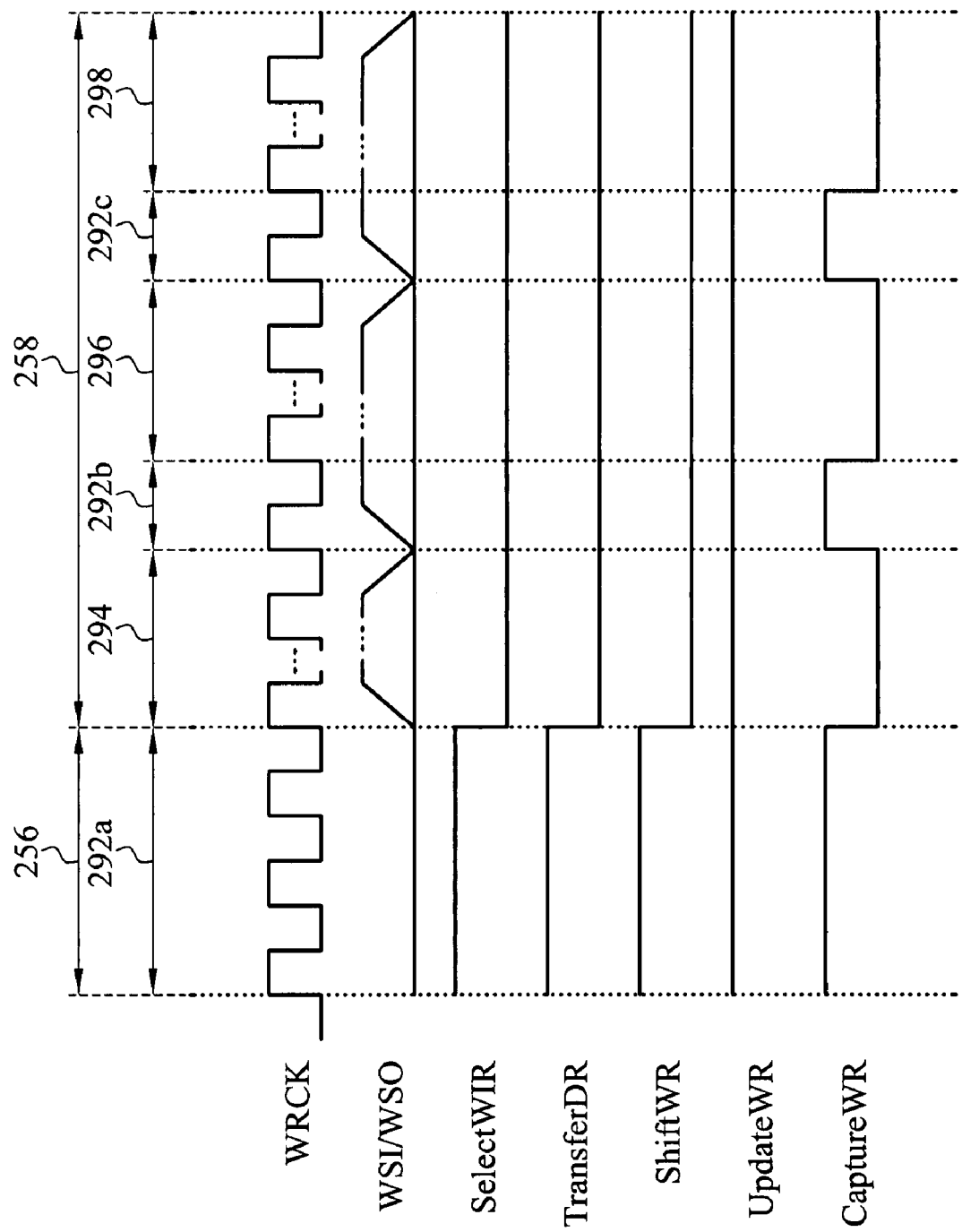
FIG. 7 illustrates a timing chart for three core circuits tested with a two-step test procedure according to the present invention.

Please simultaneously refer to FIG. 7 and FIG. 4. FIG. 7 illustrates a timing chart for three core circuits tested with a two-step test procedure in accordance with the test scheme shown in FIG. 5. The controller proceeds a bypass test 256 and a WCORETEST 258. The operation includes execution 292a, scan-in 294, execution 292b, scan 296, execution 292c and scan-out 298. To compare between FIG. 7 and FIG. 4, it is apparently that there is no instruction operation needed in FIG. 7 as well as the execution 292a, 292b, 292c operation takes only one clock cycle.

Figure 8:
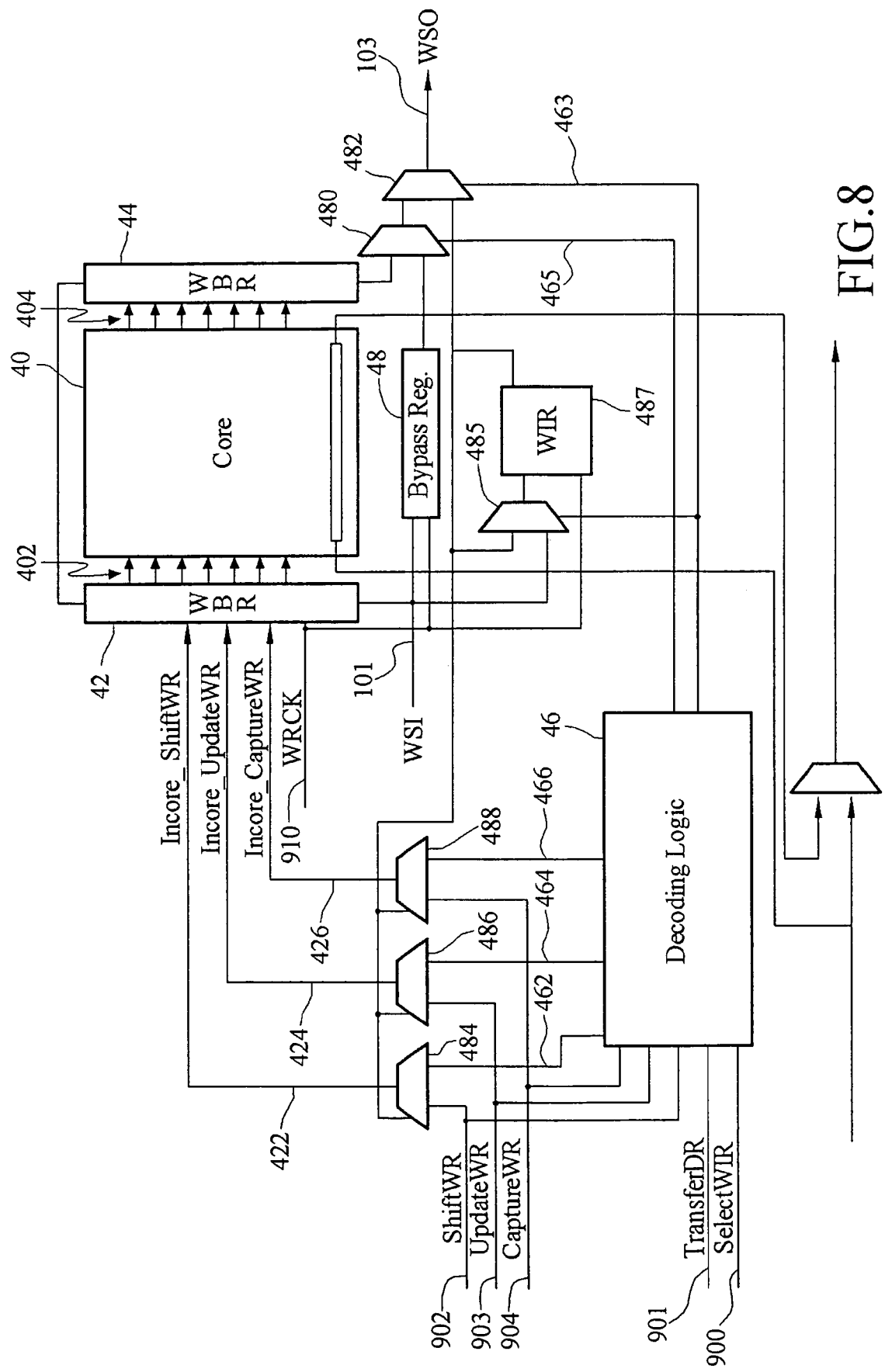
FIG. 8 illustrates another test scheme for system-on-a-chip in accordance with the invention.

Furthermore, please refer to FIG. 8 illustrating another test scheme for system-on-a-chip in accordance with the invention. The test scheme is compliance with the controller which sends out compiled signals (instruction signals) ahead of test signals. According to FIG. 8, the WBR 42, 44 are disposed corresponding to input ports 402 and output ports 404 of the core circuit 40. The control signals including ShiftWR 902, UpdateWR 903, CaptureWR 904, TransferDR 901 and SelectWIR 900 are sent to a decoding logic 46. The decoding logic 46 has a decoding table as shown in TABLE II below. The decoding logic 46 decodes the control signals into decoded signals and sends the decoded signals out through

TABLE I

| SelectWIR | TransferDR | ShiftWR | UpdateWR | CaptureWR | Instruction | In_ShiftWR |
|---|---|---|---|---|---|---|
| 0 | 0 | 0 | 0 | 0 | Normal | 0 |
| 0 | 0 | 0 | 1 | 0 | WCORETESTS scan | 1 |
| 0 | 0 | 0 | 1 | 1 | WCORETESTS Execution | 0 |
| 0 | 0 | 1 | 0 | 0 | WEXTEST scan in | 1 |
| 0 | 0 | 1 | 0 | 1 | WEXTEST Execution | 0 |
| 0 | 0 | 1 | 1 | 0 | WEXTEST scan out | 1 |
| 1 | 1 | 1 | 1 | 1 | Bypass | 1 |

| In_-UpdateWR | In_CaptureWR | Sel_WR_DR | SelectWIR |
|---|---|---|---|
| 0 | 0 | 1 | 0 |
| 0 | 0 | 0 | 0 |
| 1 | 1 | 0 | 0 |
| 0 | 0 | 0 | 0 |
| 1 | 1 | 0 | 0 |
| 0 | 0 | 0 | 0 |
| 0 | 0 | 1 | 0 |

In_ShiftWR 462, In_UpdateWR 464, In_CaptureWR 466, Sel_WR_DR 465 and In_SelectWIR 463. The multiplexers 484 are controlled by WIR 487 to select one from ShiftWR 902 and In_ShiftWR 462 to be Incore_ShiftWR 422. The multiplexers 486 are controlled by WIR 487 to select one from UpdateWR 903 and In_UpdateWR 464 to be Incore_UpdateWR 424. The multiplexers 488 are controlled by WIR 487 to select one from CaptureWR 904 and In_CaptureWR 466 to be Incore_CaptureWR 426. Incore_ShiftWR 422, Incore_UpdateWR 424, Incore_CaptureWR 426 and WRCK 910 are inputted into WBR 42, 44 for the WBR to proceed shift, update and capture operation. WSI 101 is connected to WBR 42, bypass register 48 and multiplexer 485. WRCK 910 is also inputted into bypass register 48 and WIR 487. The multiplexer 480 is controlled by Sel_WR_DR 465 to select one from WBR 44 and bypass register 48 to be outputted to multiplexer 482. The multiplexer 482 is controlled by In_SelectWIR 463 to select one from output of WIR 487 and output of multiplexer 480 to be WSO 103.

Regarding the decoding table, please refer to TABLE II below. It is similar to TABLE I. The TABLE II provides more tests to be encoded and decoded. It comprises Normal, WCORETESTS, WEXTEST, WBIST, Bypass. Each test includes one or more operations. For example, WEXTEST includes scan-in, execution, scan-out. WBIST includes enable, capture, scan-out.

Figure 1:
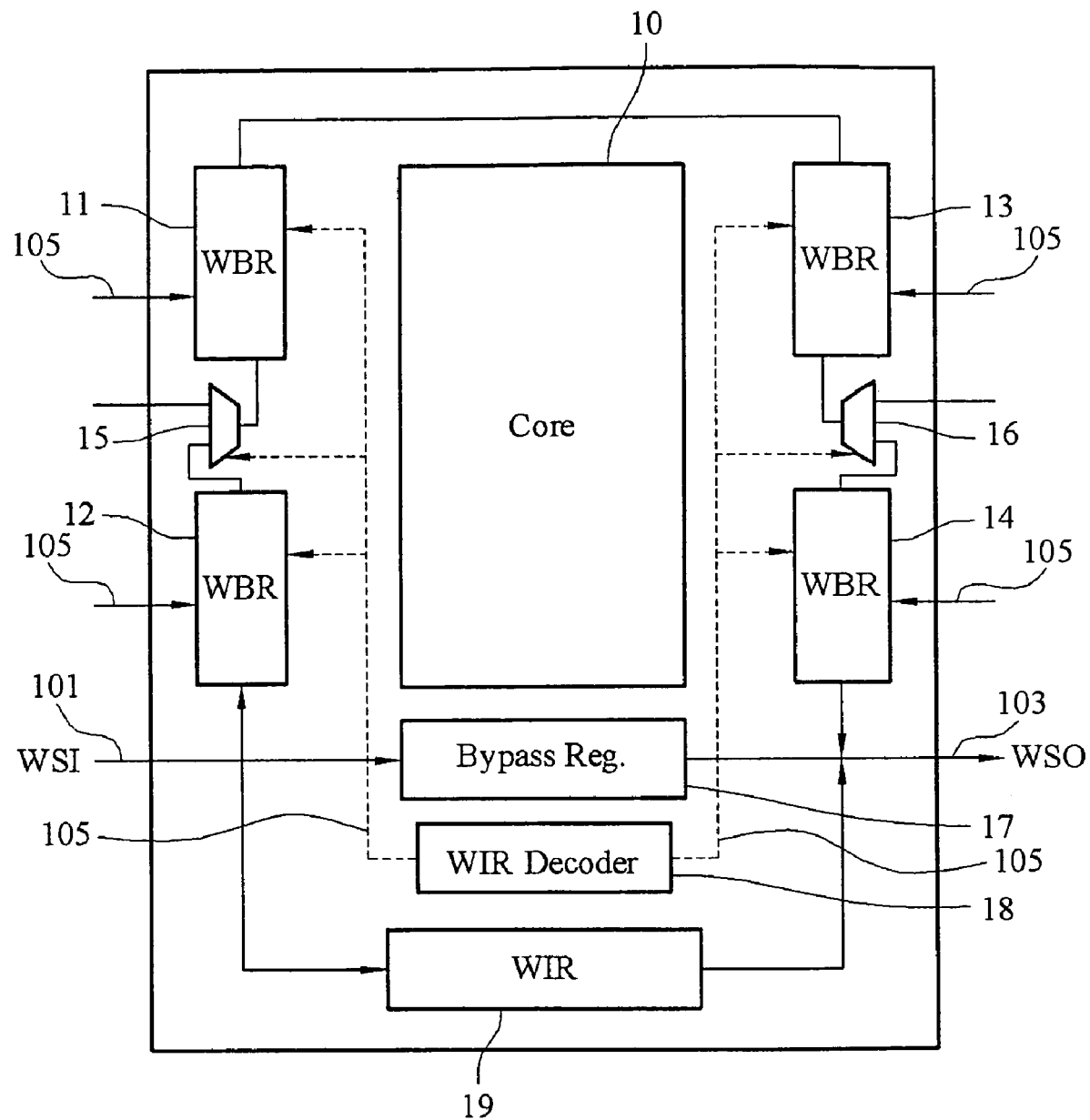
FIG. 1 illustrates a test scheme disclosed by IEEE 1500 standard.
Figure 2:
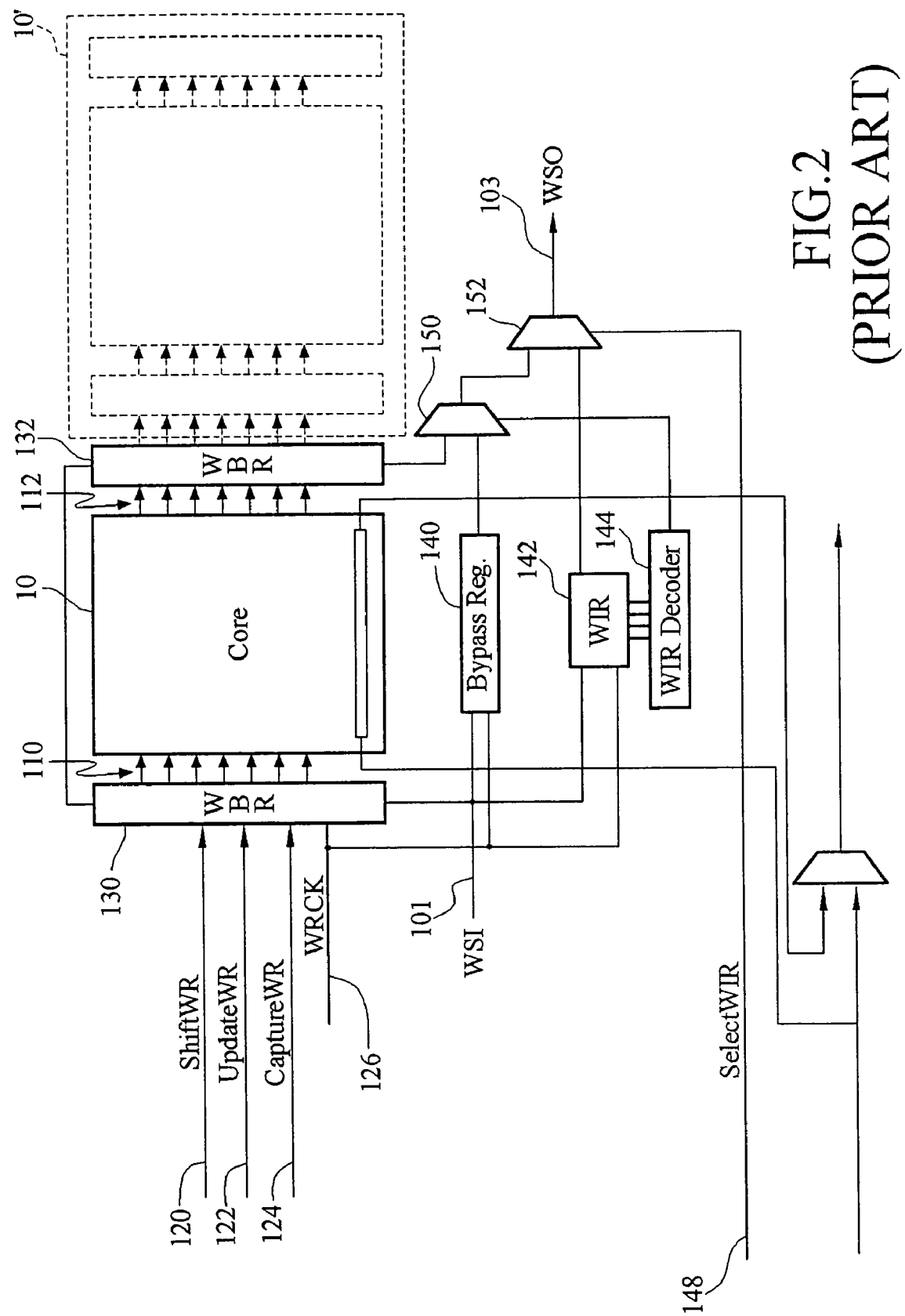
FIG. 2 illustrates a detailed test scheme disclosed by IEEE 1500 standard.
Figure 3:
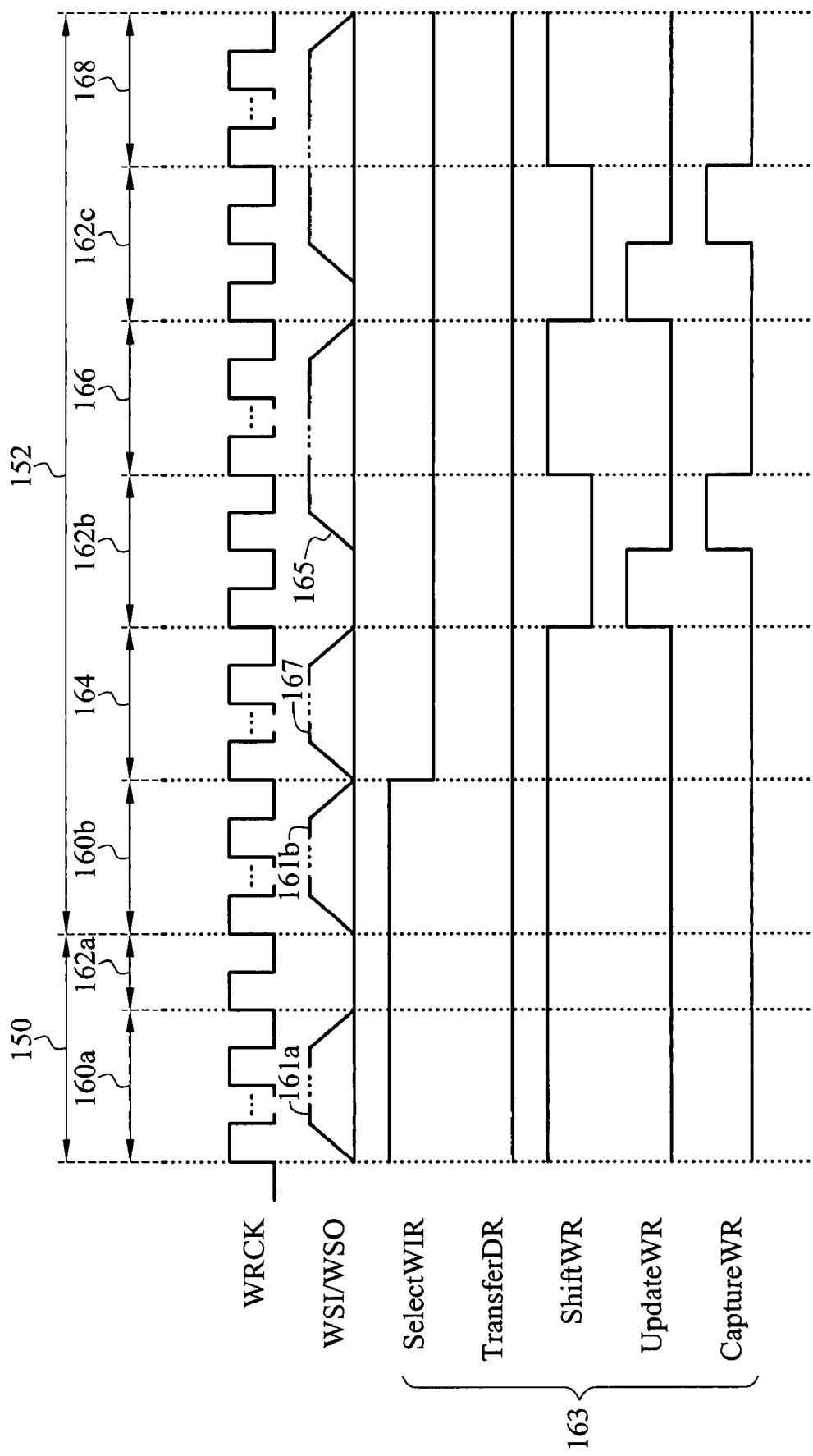
FIG. 3 illustrates a timing chart for one single core circuit tested with a two-step test procedure and an IEEE 1500 standard compliant wrapper.

165, 167 as shown in FIG. 3, the test can be done at a normal mode similar to FIG. 3 and FIG. 4.

As to decoding table, TABLE I and II are shown as illustration only. Users can encode their own decoding table with different permutation and combination according to the tests and operations they would like to test.

In accordance with the wrapper testing circuit mentioned above, a wrapper testing method of system-on-a-chip for electrical tests of at least a core circuit of a integrated circuit is provided. A controller outputs control signals and test signals and receives result signals executed by the core circuit. The control signals at least have an updating signal and a capturing signal. The method comprises steps of encoding the control signals by a decoding logic and output decoded signals; and shifting, updating and capturing the test signals for the core circuit to execute and output the result signals according to the decoded signals. As aforesaid depiction, the method saves the time that the controller transmits the compiled signal to WIR. The compiled signal is compiled by controller from the test procedure. Next, in order to make the method compliant with the controller which sends out compiled signals (instruction signals) ahead of test signals, the method further comprises the following 2 steps before the step of encoding the control signals: compiling the control signals into compiled signals ahead of the test signals; and the step of shifting, updating and capturing the signals for the

TABLE II

| SelectWIR | TransferDR | ShiftWR | UpdateWR | CaptureWR | Instruction | In_ShiftWR |
|---|---|---|---|---|---|---|
| 0 | 0 | 0 | 0 | 0 | Normal | 0 |
| 0 | 0 | 0 | 1 | 0 | WCORETESTS scan | 1 |
| 0 | 0 | 0 | 1 | 1 | WCORETESTS Execution | 0 |
| 0 | 0 | 1 | 0 | 0 | WEXTEST scan in | 1 |
| 0 | 0 | 1 | 0 | 1 | WEXTEST Execution | 0 |
| 0 | 0 | 1 | 1 | 0 | WEXTEST scan out | 1 |
| 0 | 1 | 0 | 0 | 0 | WBIST enable | 0 |
| 0 | 1 | 0 | 0 | 1 | WBIST capture | 0 |
| 0 | 1 | 0 | 1 | 0 | WBIST scan out | 1 |
| 1 | 1 | 1 | 1 | 1 | Bypass | 1 |

| In_UpdateWR | In_CaptureWR | Sel_WR_DR (2bits) | SelectWIR |
|---|---|---|---|
| 0 | 0 | 01 | 0 |
| 0 | 0 | 00 | 0 |
| 1 | 1 | 00 | 0 |
| 0 | 0 | 00 | 0 |
| 1 | 1 | 00 | 0 |
| 0 | 0 | 00 | 0 |
| 0 | 0 | 01 | 0 |
| 1 | 1 | 10 | 0 |
| 0 | 0 | 10 | 0 |
| 0 | 0 | 01 | 0 |

In accordance with the test scheme shown in FIG. 8 and decoding table shown in TABLE II, the present invention can be operated as time-saving mode or normal mode. For instance, if the controller sends out control signals according to TABLE II, the test can be done at a time-saving mode similar to FIG. 6 and FIG. 7. If the controller compiles control signals into compiled signals 161a, 161b ahead of test signals core circuit to execute and output the result signals is according to the decoded signals and the compiled signals.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A wrapper testing circuit of system-on-a-chip for electrical tests of at least a core circuit of an integrated circuit, a controller outputting control signals and test signals and receiving result signals executed by the core circuit, the wrapper testing circuit comprising:
   a decoding logic having a signal decoding table, the decoding logic receiving the control signals and issuing decoded signals according to the signal decoding table; and
   a plurality of wrapper boundary registers (WBR), shifting, updating and capturing the test signals for the core circuit to execute and output the result signals according to the decoded signals.

2. The wrapper testing circuit according to claim 1, wherein the WBR updates and captures the test signals in one clock cycle.

3. The wrapper testing circuit according to claim 1, further comprising:
   a bypass register, receiving the test signals and bypassing the test signals; and
   a multiplexer, receiving both the test signals from the bypass register and the result signals from the WBR and selectively outputting the received test signals or the received result signals to the controller.

4. The wrapper testing circuit according to claim 1, wherein the controller compiles the control signals ahead of the test signals, the wrapper testing circuit further comprising:
   a wrapper instruction register (WIR), receiving and storing the compiled signals ahead of the test signals;
   wherein the WBR shifts, updates and captures the test signals for the core circuit to execute and output the result signals according to the decoded signals from the decoding logic and the compiled signals from the WIR.

5. The wrapper testing circuit according to claim 4, further comprising:
   a bypass register, receiving the test signals and bypassing the test signals; and
   a multiplexer, receiving both the test signals from the bypass register and the result signals from the WBR and selectively outputting the received test signals or the received result signals to the controller.

6. The wrapper testing circuit according to claim 5, wherein the WBR updates and captures the test signals in one clock cycle.

7. A wrapper testing method of system-on-a-chip for electrical tests of at least a core circuit of a integrated circuit, a controller outputting control signals and test signals and receiving result signals executed by the core circuit, the control signals at least having an updating signal and a capturing signal, the method comprising steps of:
   decoding the control signals by a decoding logic and output decoded signals; and
   shifting, updating and capturing the test signals for the core circuit to execute and output the result signals according to the decoded signals.

8. The wrapper testing method according to claim 7, wherein before the step of encoding the control signals, the wrapper testing method further comprises steps of:
   compiling the control signals into compiled signals ahead of the test signals; and
   the step of shifting, updating and capturing the signals for the core circuit to execute and output the result signals is according to the decoded signals and the compiled signals.

* * * * *